April 5, 1960 A. D. RITTMANN 2,931,743

METHOD OF FUSING METAL BODY TO ANOTHER BODY

Filed May 2, 1955

Inventor:
Albert D. Rittmann
by his Attorneys
Howson & Howson

United States Patent Office 2,931,743

Patented Apr. 5, 1960

2,931,743

METHOD OF FUSING METAL BODY TO ANOTHER BODY

Albert D. Rittmann, Huntingdon Valley, Pa., assignor to Philco Corporation, Philadelphia, Pa., a corporation of Pennsylvania Application May 2, 1955, Serial No. 505,390

10 Claims. (Cl. 148—1.5)

The present invention relates to a method for fusing a metal body to another body; and, more particularly, the invention relates to a process wherein a relatively minute body of metal is applied to another body and heated to cause interfacial fusion between the two bodies in which process the relatively minute metal body, during fusion, is maintained in the precise position and configuration provided during its initial application to the base body. The invention also relates specifically to a novel process for providing a junction in a body of semi-conductive material between regions of dissimilar electrical properties in the fabrication of semi-conductive devices such as diodes, triodes, and the like.

There are many instances in the electrical and electronic fields where it is desired to provide a contact between a relatively minute metal body and another body through alloying or interdiffusion at the interface between the two bodies by the application of heat. A typical example is in the preparation of junction diodes. Such a diode may comprise a small, thin wafer of semi-conductive material containing an appropriate "significant impurity" imparting either "P" or "N" type conductivity. Located in this semi-conductive wafer is a region of different conductivity provided by applying a relatively minute body of an appropriate metal to the semi-conductive base wafer and, by heat treatment, alloying the two materials together at the interface, and then cooling to cause recrystallization of the semi-conductive material. The region at which the conductivity change occurs is termed a junction and is ordinarily characterized by rectifying properties. Likewise, the manufacture of transistors involves preparation of a triode comprising a pair of junctions of the type discussed above.

The performance of these junctions depends heavily upon their area and location in the base wafer. This is particularly true in the case of transistors where, for best gain and highest frequency response, it is usually desirable that the junctions be as close together as possible without actually touching. An example of this is the conventional alloy junction transistor in which the junctions are formed by alloying metals in from opposite sides of the base wafer, in which case it is desirable that the junctions be substantially plane-parallel and closely spaced.

In the usual procedure for preparing junctions of the type described, a thin wafer of semi-conductive material is prepared and cleaned. In the case of the conventional alloy junction transistor referred to above, this wafer is also preferably provided with closely-spaced apart, parallel depressions in the opposite faces. These depressions may be applied as by jet etching, that is by directing a stream of electrolytic etching solution normal to the surfaces of the wafer and completing the electrical circuit between the stream and the wafer. A quantity of metal of appropriate type is then applied to the surface of the wafer where the proposed junction is to be provided, as by electroplating, chemical plating, vacuum depositing, cathode sputtering, or the like. The entire assembly is then heated to a temperature sufficient to cause alloying of the applied metal into the semi-conductor base. In the case of the stated transistors, this alloying must be controlled so that the fronts of the two approaching metallic solutions approach but do not reach each other. The assembly is then cooled at the appropriate time, the base semi-conductive material re-crystallizes and the desired junction or junctions are formed.

To produce a so-called P-N-P triode assembly for a transistor, for example, the base wafer of semi-conductive material is of N-type conductivity, which means that it contains an excess of conduction band electrons and conduction therein is principally by means of electrons. This situation occurs when a semi-conductor contains minute traces of "donor impurities." For the P-N-P type alloy junction transistor, the metals alloyed in from the opposite sides are then of the type which provide P type conductivity in the semi-conductor. Such metals will be referred to herein as "acceptor" type metals. When these metals are alloyed into the opposite faces of the wafer and the assembly cooled, the recrystallized base material regions contain a minute excess of the acceptor metal resulting in the production of so-called "holes" and providing P type regions on each side of the central N type base material.

In the preparation of N-P-N triode assemblies, the base wafer will be of the P-type, and the metals alloyed in from the opposite sides will comprise "donor" elements to provide N type regions on each side of the central P base material.

In either of these cases, if the alloying is carried too far and the junctions meet, the device will not operate as a transistor. Even if the junctions do not meet but are too close, the device may be susceptible to breakdown upon the application of only moderately large operating potentials. If the spacing between the junctions is too large, the possible gain of the device decreases, and, because of the longer transit time for current carriers through the central region, the frequency performance also deteriorates. The area of junction at the interface is also important. In triode assemblies, for example, a definite relationship preferably exists between the areas of the two opposed junctions in order for optimum functioning as "emitter" and "collector," respectively.

In any event, it is highly important in the production of junction diodes and transistors of this general type to be able to control accurately the degree of penetration of the applied "acceptor" or "donor" impurities and the lateral areas of the junctions between the regions of differing conductivity.

In the fabrication of such alloy junctions, one difficulty which has existed is caused by the tendency of the applied, relatively minute body of metal to "ball up" due to surface tension during the heating operation, so that the surface area actually subjected to alloy is, in general, not the same as that contacted initially by the metal. This not only destroys the lateral area initially provided but also results in unequal and uncontrollable depths of alloying. Attempts have been made to place the metal to be alloyed into the central aperture of a "washer" and to hold this assembly against the semi-conductive base wafer during alloying. Attempts have also been made to apply mechanical pressure to the metal during alloying in order to hold it against the semi-conductive wafer surface. None of these expedients produces the absolute control of the dimensions of the contact between the metal body and the semi-conductor base which is desired. In addition, such expedients are inconvenient, especially from the standpoint of mass production, and they are particularly difficult to employ when the metal body is located within a tiny, etched depression. Moreover, these expedients tend to exert deleterious stresses and strains on the base wafer.

It is the principal object of the present invention to provide a novel method for fusing a metal body to another body.

It is another object of the present invention to provide a novel process wherein a relatively minute metal body is applied to another body and heated to cause interfacial fusing between the two bodies in which process the relatively minute metal body, during fusing, is maintained in the precise position and configuration provided during its initial application to the base body.

It is still another object of the present invention to provide a novel method for preparing an alloy junction in a semiconductive body by a heating operation during which a relatively minute body of metal to be alloyed to the semi-conductor is prevented from "balling up" or otherwise distorting during heating.

A further object of the present invention is to provide a method for preparing an alloy junction between regions of differing conductivity within a semi-conductive body, such as in the fabrication of diode and triode junction devices, involving alloying of a relatively minute metal body containing a donor or acceptor material into a semi-conductive base during which process the depth of alloy penetration and the lateral area of the alloy junction is accurately controlled.

Other objects will become apparent from a consideration of the following specification and the claims.

In accordance with the process of the present invention, the body of metal which is to be bonded by interfacial fusion to the base body is applied to the base and there is provided thereover and adhering to the exposed surfaces of the applied metal body and at least the immediately adjacent surfaces of the base, a rigid, solid body of refractory material conforming to the exposed contours of the applied metal body whereby during the heating operation the shape and position initially provided to the metal body is maintained.

This body of refractory material is preferably provided by applying a flowable suspension of finely-divided, refractory, inorganic material over the applied metal body so that it covers and surrounds the exposed surfaces of the applied metal body and covers at least the immediately adjacent surfaces of the base body. This coating is then permitting to harden in situ to provide a solid, rigid mold or jig conforming precisely to the exposed contours of the metal body and adhering to the metal body and immediately adjacent surfaces of the base. The assembly may then be heated to cause alloying between the metal body and the underlying base material at the interface. During alloying the solid coating holds the metal body in the precise position and shape in which it was initially applied to the base. The assembly is then cooled, and the refractory material removed.

The invention will be more readily understood from a consideration of the drawings in which.

Figure 1:
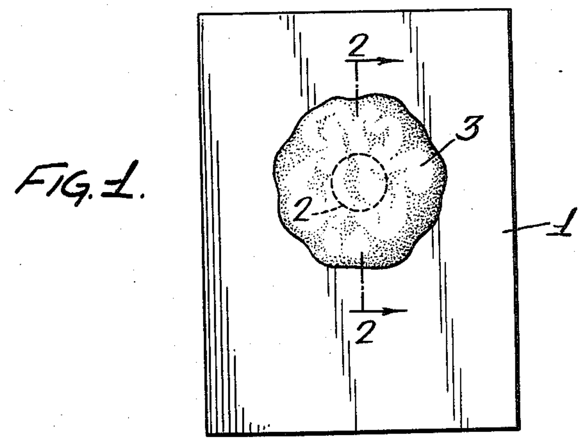
Figure 1 is a front elevational view, greatly enlarged, of one face of a diode or triode assembly having the refractory coating thereon.

The present process provides a means by which the metal body to be fused to a base body may be retained, during the fusing step, in its initially-provided position and shape, and without flowing, "balling up," or otherwise distorting due to softening at the interface or of the entire metal body. It has been found that with the size of the metal body, which is preferably relatively minute, that is fused or alloyed into the base body, the hardened, solid coating of finely-divided refractory material actually provides a strong, rigid mold or jig which conforms to all the exposed surfaces and contours of the relatively minute metal body, holds it in place against the base and prevents its distortion during the heating operation. Thus, during the heating operation, the lateral area of the interface between the relatively minute metal and the under-lying base body, which is initially established when the relatively minute metal body is applied to the base before the heating operation, is maintained, and by virtue of this the depth of fusion or alloy penetration can be more readily and accurately controlled. The process is very simple, and lends itself readily to mass production techniques. Moreover, unlike prior expedients for holding the relatively minute metal body to the base, the means employed in accordance with the present invention exerts no stress or strain on the base.

The process of the present invention, in its broader aspects, is applicable for the joining of any relatively minute metal body to another body by fusion between the two bodies wherein the assembly is subjected to heat at least to provide a region of softened material at the interface. The present invention broadly is not concerned with the nature of the metal body and of the base to which it is applied as long as the metal body can be fused to the base through the agency of heat. Therefore, the base may be metal, for example, steel, including alloy steels, copper, copper alloys, chromium, chromium alloys, nickel, nickel alloys, tin, tin alloys, silicon, germanium, various alloys including germanium-silicon, indium-antimony, or the like, ceramic, including glass, and the like. Depending upon the particular base, and, of course, upon the characteristics desired in the final structure, the relatively minute metal body may be antimony, bismuth, aluminum, gallium, indium, tin, silver, gold, alloys containing one or more of these, or the like.

During the fusion of the metal body to the base there will be a region at the interface of softened material representing the interdiffusion of the metal of the applied metal body and the base material. It is not necessary that the entire applied metal body melt since in some cases there will form at the interface an alloy having a melting point below that of either the base or the applied metal body. In other cases, the entire applied metal body will become molten. In either case the method of the present invention presents distortion which might otherwise occur during the heating operation. The present invention is particularly applicable in the fusion of a metal body to a metal base, especially where the metal body has a melting point below that of the metal base and becomes substantially entirely softened or molten during the heating operation.

In the expression "relatively minute metal body" used herein and in the claims the term "relatively minute" refers to the general dimensions of the metal body to be joined to the base. The present process is particularly applicable for use when the metal body to be joined to the metal base ranges in thickness up to about 100 mils, and in lateral dimensions up to about one inch.

As stated the present process finds especial utility in the preparation of junctions in the fabrication of semiconductor diode and triode assemblies. In this case, a small "dot" of metal comprising a "significant impurity"

is applied to a "wafer" of a semi-conductor material, usually between about 1 and about 20 mils thick. The assembly is then heated to cause melting of the applied metal dot and alloying thereof into the semi-conductor base at the interface between the dot and the wafer.

As is well known the semi-conductor base wafer will consist essentially of silicon, germanium, tin, germanium-silicon alloy, indium-antimony alloy, or the like, preferably silicon or germanium, and a trace of a "significant impurity" providing the desired type of conductivity to the base. The expression "significant impurity" as used in this connection refers, as is well known, to those impurities which effect the electrical characteristics of the semi-conductive material including resistivity, photosensitivity, rectification, etc., and which are either intentionally added to the principal semi-conductive base material or are associated with the base material in its natural state or by virtue of the particular means of manufacture. Thus, if the semi-conductor base wafer is to possess N type conductivity, the significant impurity will be of the donor type thereby providing an excess of electrons so that conduction therein is principally by means of electrons. The so-called "donor" impurities are generally those elements in column V of the periodic table, especially antimony, phosphorus, arsenic, bismuth and nitrogen. Antimony and bismuth are presently preferred. If the semi-conductor base is to possess P type conductivity it will contain an "acceptor" impurity which tends to trap electrons resulting in the production of so-called "holes." The acceptor impurities are generally those elements from column III of the periodic table, especially boron, aluminum, gallium and indium. Aluminum and indium are presently preferred. The semi-conductor base will also have consistent Hall and thermo-electric effects.

The exact nature of the metal dot joined to the above-described semi-conductor base wafer will depend upon the nature of the base and upon the characteristics desired in the joined assembly. The considerations governing this are well known to those skilled in the art, and form no part of the present invention. Briefly, in the fabrication of diodes, if the semi-conductor base is of the N-type the metal dot joined thereto will contain acceptor or donor type materials, most usually the former, and if the semi-conductor base is of the P-type the metal dot will contain acceptor or donor type materials, most usually the latter. In most cases the metal dot joined to the base will be of a type to produce conductivity opposite to that of the base. In the fabrication of triodes by the present type procedure, if the semi-conductor base if of the N type, the metal dots joined to the opposing faces of the base wafer will both be of the acceptor type, and vice versa.

The donor and acceptor materials which the dot may comprise have been described above. If the donor or acceptor material is a suitable metal it may be used as such and applied as the metal dot to the base wafer. On the other hand, the desired donor or acceptor material may be extended in a suitable metal, such as gold, or the like, to provide a metal dot comprising the desired donor or acceptor material.

As a preliminary step in the present process, the relatively minute metal body to be joined by heat fusion to the base, is applied to the base. It is relatively immaterial how this relatively minute metal body is initially applied to the base, and it may be, in the form of a pellet, flake, or film, such as a piece of foil, merely laid on the surface of the base. However, it is preferred that this application be by a deposition process causing adhesion between the applied relatively minute metal body and the base, such as by electro-plating, chemical plating, vacuum evaporation, cathode sputtering, or the like. During this step the position of the relatively minute metal body with respect to the base and its lateral dimensions are determined, and a suitable mask may be employed for this purpose. In the case of a fabrication of a diode assembly, only one such relatively minute metal body is applied and this only to one face of the base. In the case of the fabrication of a triode assembly, two such relatively minute metal bodies are applied, one to each of the opposite faces of the base wafer. In many instances, one of these metal bodies will be larger laterally than the other thus providing "collector" and "emitter" electrodes. In the preparation of one type of diode or triode assembly, the surface or surfaces of the base wafer will be jet etched to provide depressions within which the relatively minute metal body or bodies will be applied. Such depressions serve, in the case of triodes, to bring the applied metal dots as close together as possible while still being separated from each other by a thin wall of semi-conductor base.

After the relatively minute metal body or bodies have been applied to the base, there is applied thereover a flowable suspension of finely-divided refractory material so as to coat, cover and conform to the exposed contours of the relatively minute metal body and at least the immediately adjacent surfaces of the base. The coating is then permitted to harden. Several applications of the coating material may be applied, each being followed by at least partial hardening to build up the desired thickness of coating. This coating material, upon hardening, forms a rigid mold or jig adhering and conforming to the exposed contours of the relatively minute metal body, and adhering to the adjacent surfaces of the base, and thus serving to maintain the position and shape of the relatively minute metal body and to hold it against the base during the heating and alloying operation.

In a preferred embodiment of the present process, particularly applicable when relatively minute metal bodies in the upper portion of the dimension range set forth hereinabove are to be joined to the base, there is provided a supplementary backing or reinforcing member which is placed over the applied coating while it is still wet so as to adhere thereto. This backing or reinforcing member may be flat or concave and may be of any desired rigid material, such as graphite, metal, ceramic, or the like, which is stable at the temperature of heat treatment.

Referring specifically to the coating composition, it will be, as stated, a flowable suspension of a finely-divided refractory material. The suspension may be liquid in which case it will flow under its own weight or may be plastic thereby flowing only under the application of pressure. At any rate it must be flowable so that it will conform to the contours of the exposed surfaces of the applied relatively minute metal body.

The composition will also be capable of hardening after application, and this hardening may be by virtue of the evaporation of the liquid vehicle, or by virtue of hydration as in the case of a hydraulic cement.

The finely-divided refractory material will most generally be inorganic in nature and may be selected from a wide variety of such materials so long as it is stable, solid and inert to the under-lying relatively minute metal body at the temperatures encountered during the heat treatment. Examples of materials that may be employed as inert, finely-divided particles forming a hardened coating by virtue of the evaporation of liquid vehicle in which the particles are suspended are; carbon, especially graphite; oxides, such as ilicon dioxide, aluminum oxide, magnesium oxide, strontium oxide, chromium oxide, zirconium dioxide, and the like; carbides, such as silicon carbide; high melting silicates such as talc, mica, and the like. In this connection, graphite has been found to be particularly suitable. Examples of finely-divided materials forming a hardened coating by hydration are the hydraulic cements such as plaster of Paris, Portland cement, aluminum cement, and the like.

The refractory material will be, as stated, finely-divided, and the exact size of particles selected may depend upon the relative size of the relative minute metal body and the method by which it is applied to the base member. For example, if the relatively minute metal body has dimensions in the upper end of the dimension ranges set forth hereinabove and is applied to the base member by a method leaving a gap at the interface between it and the base, it may be desirable to employ particles of the size that will not enter into the gap. Hence, in this case it may be desirable to employ particles having a size up to about 2 mils in diameter. In most instances, however, the particles will be somewhat finer and will have diameters of less than about 1 mil. Where the relatively minute metal body is in the lower end of the dimension range and is applied by a means not providing any significant gap at the interface between it and the underlying base metal, the lower limit of the particle size is not important, and colloidal particles may readily be employed. In this connection, colloidal graphite has been found to be particularly suitable.

As stated, the finely-divided refractory material will be applied in the form of a flowable suspension, and for this purpose any liquid vehicle may be employed. Water, because it is inexpensive, is particularly suitable, although more volatile solvents, such as alcohol, naphtha, mineral spirits, and the like, may be employed as may be less volatile liquids such as glycerine and the glycols. In the case of the latter vehicles, the initial stages of the heating operation may be relied upon to evaporate them away from the coating composition. Where the finely-divided refractory material possesses hydraulic properties such as the hydraulic cements mentioned above, the vehicle will be water to provide a settable mass. The amount of liquid vehicle employed is not critical and may range from that just sufficient to provide a plastic, dough- or putty-like mass up to that providing a freely flowing, paint-like slurry.

A binder may also be incorporated in the coating composition. If a binder is desired, any material, soluble in the particular vehicle employed and stable at the temperature of the heating operation may be employed. In this connection, sodium silicate (water glass) has been found to be particularly suitable.

A conventional dispersing agent may also be incorporated in the coating composition to disperse the particles throughout the liquid vehicle and to retard settling.

The coating composition may be applied in any desired manner, depending upon its physical nature. If it is liquid it may be applied as by dipping the entire assembly into a body of the material, or by applying it by brushing, spraying, casting, or the like. A plastic composition may be pressed on and around the applied relatively minute metal body like modelling clay. As stated, it may be desirable to apply a plurality of layers of the coating composition following each of which the coating is permitted at least partially to harden. In this manner a coating of any desired thickness may be built up. The thickness of the ultimate coating will, of course, be governed by the particular application including the dimensions of the relatively minute metal body.

Following the application of the coating, the assembly is heated to cause fusion of the applied metal body to the base. Since the particular time and temperature conditions employed will depend upon the nature of the relatively minute metal body and of the base, it is not possible to set forth temperature conditions that will be applicable in every case. However, no difficulty will be encountered by those familiar with the art in selecting the particular time-temperature conditions to suit any combination of relatively minutes metal body and base. For example, where the relatively minute metal body is aluminum and the base is silicon a temperature of about 900° C. for about one minute at temperature is suitable.

Because the hardened coating applied over the assembly conforms to the exposed contours of the relatively minute metal body forming a rigid mold or jig thereabout, the relatively minute metal body cannot flow, "ball up," or otherwise distort during the heating operation. Hence the precise position and configuration imparted to it during its initial application to the base is retained and the area of the junction between it and the base as well as the depth of penetration can be readily controlled.

After the assembly is cooled, the coating no longer has any function and it may readily be removed by any suitable means, such as by sand blasting, scraping, or the like. Because in many instances the coating will be porous, the assembly may be usbjected to a chemical treatment whereby the chemical penetrates the coating, attacking the surfaces of the underlying relatively minute metal body and base sufficiently to destroy the bond between them and the coating. Solutions of acids, such as nitric and hydrofluoric acid, and bases, such as sodium hydroxide, as well as of certain salts, such as cesium fluoride, depending upon the particular materials employed, may be employed for this purpose. Combinations of chemical treatment and mechanical removing means may be required.

The drawings illustrate assemblies prepared according to the invention having the refractory coating thereon. Figure 1 is a front elevational view, enlarged, of one side of a diode or triode assembly during fabrication. 1 represents the semi-conductor base wafer of, for example, silicon or germanium having suitable N- or P-type conductivity depending upon the particular "significant impurity" therein. 2 is the relatively minute body or "dot" of significant impurity metal, such as aluminum or indium, to provide a junction at the interface of different conductivity from the base 1. 3 is the finely-divided, refractory material-containing coating over body 2 and the adjacent surfaces of base 1.

Figure 2:
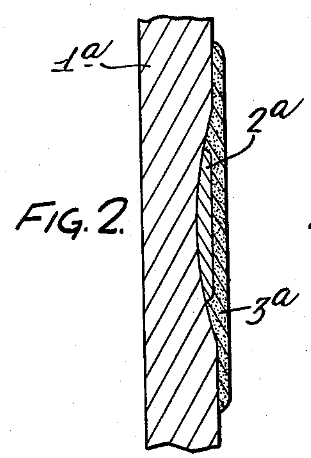
Figure 2 is a side elevational view, in section, of a diode assembly prepared in accordance with one embodiment.

In Figure 2 is shown a cross-section, such as taken along line 2—2 of Figure 1, of a diode assembly prepared in accordance with one embodiment of the process. *1a* is the semi-conductor base wafer, and *2a* is the significant impurity metal body, or "dot." Metal body *2a* is located in a depression in base *1a* formed as by jet etching. *3a* is the coating of finely-divided refractory material. It will be noted that coating *3a* conforms to the contours of metal body *2a*.

Figure 3:
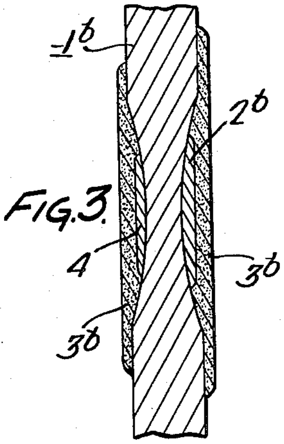
Figure 3 is a side elevational view in section, of a triode assembly prepared in accordance with one embodiment.

Figure 3 illustrates the fabrication of a triode assembly wherein two significant impurity metal bodies, or "dots" *2b* and 4, are joined to the opposite faces of base *1b*. In this case, as in Figure 2, the metal bodies *2b* and 4 are located in depressions jet etched into base *1b*. *3b* is the coating of finely-divided refractory material over both metal bodies *2b* and 4.

Figure 4:
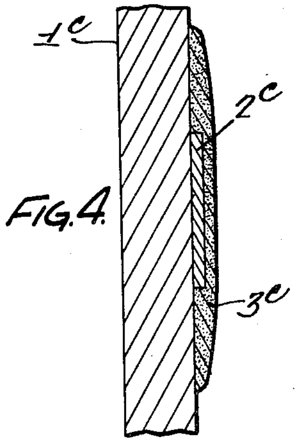
Figure 4 is a side elevational view, in section, of a diode assembly prepared in accordance with another embodiment of the process.

Figure 4 illustrates another means of providing a diode assembly wherein the metal body *2c* is merely applied to the surface of base *1c* without providing a depression in base *1c*. *3c* is the coating of finely-divided refractory material covering and conforming to the contours of metal body *2c*.

Figure 5:
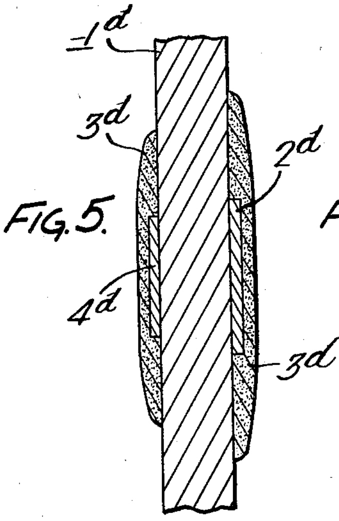
Figure 5 is a side elevational view, in section, of a triode assembly prepared in accordance with another embodiment of the process.

Figure 5 illustrates the fabrication of a triode assembly using the same embodiment illustrated in Figure 4 wherein the significant impurity metal bodies *2d* and *4d* are merely applied to the surface of base *1d* without providing depressions as by jet etching. *3d* is the coating of refractory material over and conforming to the contours of metal bodies *2d* and *4d*.

Figure 6:
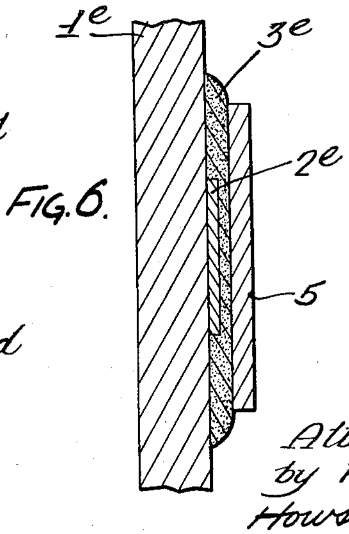
Figure 6 is a side elevational view, in section, of a diode assembly prepared in accordance with still another embodiment of the process.

Figure 6 illustrates the use of back up or reinforcing means. In this embodiment, metal body *2e* is applied to base member *1e*, and finely-divided refractory coating *3e* is applied thereover. While at least the outer layer of coating *3e* is still wet and flowable, there is pressed thereover a flat rigid member, such as disc or plate 5, which adheres to the wet coating *3e* and provides additional support or reinforcement for retaining the shape of metal body *2e* and preventing its distortion during the heating operation.

The operation of the present process will be more readily understood from a consideration of the following specific example which is given for the purpose of illustration only and is not intended to limit the scope of the invention in any way.

*Example*

A silicon wafer 100 mils by 200 mils by 20 mils thick is etched to a thickness of 4 mils.

The blank wafer is then jet etched using a 0.2 normal sodium fluoride solution to which hydrochloric acid has been added to drop the pH to 3.5. By this means pits of 15 and 30 mils diameter, respectively, for emitter and collector are etched into opposing surfaces of the wafer until the remaining thickness between the pits is only 0.7 mil.

The blank wafer is then placed between masks having holes of 10 and 15 mil diameters, respectively, for the emitter and collector, respectively, and the assembly aligned. Aluminum is then evaporated through the masks into the bottoms of the pits to a thickness of about 0.5 mil. The wafer is then removed from the masks, and dipped in a suspension prepared by mixing 200 grams of colloidal graphite, 150 grams of sodium silicate and a small amount of a dispersing agent with 600 ml. of water. After the coating is dry, the assembly is heated at 900° C. for about one minute. The temperature rise time to 900° C. is about one minute and the fall time to room temperature is about four minutes.

After cooling, the graphite coating is removed and the resulting transistor element cleaned in one operation by dipping the assembly into a solution prepared by mixing 15 ml. of acetic acid (99.8%), 25 ml. nitric acid (69.9%), 15 ml. of hydrofluoric acid (49.5%) and 11 drops of bromine. The coating, being porous, allows this etching solution to reach the aluminum and the silicon. The etching of the aluminum and the silicon destroys the bond between the coating and those bodies, and the gases evolved in the etching cause the graphite coating to flake off.

The aluminum dots, after the removal of the coating have the same shape, position and dimensions as when initially applied.

Considerable modification is possible in the selection of the finely-divided refractory material and vehicle therefor as well as in the exact techniques followed in practicing the process without departing from the scope of the present invention.

I claim:

1. In the fusion of a metal body with another body involving applying the metal body to the base with which it is to be fused, heating the assembly to effect interfacial fusion between the metal body and the base, and then cooling the assembly, the improvement which comprises, after applying the metal body to the base and prior to heating the assembly, applying a flowable suspension of finely-divided refractory material over the exposed surfaces of the applied metal body, but not between the applied metal body and the base, and over at least the immediately adjacent surfaces of the base and permitting it to harden in situ to provide a rigid, solid body of refractory material conforming to and completely covering the exposed contours of said metal body and adhering to the exposed surfaces of said metal body and at least the immediately adjacent surfaces of the base whereby, during the heating operation, the shape and position initially provided to the metal body is maintained by said in situ-hardened refractory material, said refractory material being solid and inert to said applied metal body during said heating operation.

2. The method of claim 1 wherein said suspension is a liquid suspension of finely-divided graphite.

3. In the fusion of a relatively minute metal body to another metal body base involving applying the relatively minute metal body to the metal base with which it is to be fused, heating the assembly to effect interfacial fusion between the relatively minute metal body and the base, and then cooling the assembly, the improvement which comprises, after applying the relatively minute metal body to the metal base and prior to heating the assembly, applying a flowable suspension of finely-divided refractory material over the exposed surfaces of the applied relatively minute metal body, but not between the applied metal body and the base, and over at least the immediately adjacent surfaces of the base and permitting it to harden in situ to provide a rigid, solid body of refractory material conforming to and completely covering the exposed contours of said relatively minute metal body and adhering to the exposed surfaces of said relatively minute metal body and at least the immediately adjacent surfaces of the base whereby, during the heating operation, the shape and position initially provided to the relatively minute metal body is maintained by said in situ-hardened refractory material, said refractory material being solid and inert to said applied metal body during said heating operation.

4. The method of claim 3 wherein said suspension is liquid suspension of finely-divided graphite.

5. In the fusion of a relatively minute metal body with another metal body involving applying a relatively minute metal body to the metal base with which it is to be fused, said relatively minute metal body having a metal point below that of the metal base, heating the assembly to melt the relatively minute metal body and to effect interfacial fusion between it and the base, and then cooling the assembly, the improvement which comprises, after applying the relatively minute metal body to the metal base and prior to heating the assembly, applying a flowable suspension of finely-divided refractory material over the exposed surfaces of the applied relatively minute metal body, but not between the applied metal body and the metal base, and over at least the immediately adjacent surfaces of the base and permitting it to harden in situ to provide a rigid, solid body of refractory material conforming to and completely covering the exposed contours of said relatively minute metal body and adhering to the exposed surfaces of said relatively minute metal body and at least the immediately adjacent surfaces of the base whereby, during the heating operation, during which the relatively minute metal body is melted, the shape and position initially provided thereto is maintained by said in situ-hardened refractory material, said refractory material being solid and inert to said applied metal body during said heating operation.

6. The method of forming a junction of accurately controlled dimensions in a body of semi-conductive material by the alloy process which comprises applying to a surface of said semi-conductive material a relatively minute body of metal comprising a significant impurity, coating all the exposed surfaces of said relatively minute metal body, but not the surface between the relatively minute metal body and the semi-conductive base, and at least the immediately adjacent surfaces of the semi-conductive base with a flowable suspension of finely-divided refractory material, permitting the coating to harden in situ to provide a rigid, solid body of refractory material conforming to and completely covering the exposed contours of said relatively minute metal body and adhering to the exposed surfaces of said relatively minute metal body and at least the immediately adjacent surfaces of said semi-conductive base, and heating said assembly to cause alloying of the relatively minute body with said semi-conductive base, said refractory material being solid and inert to said relatively minute metal body during said heating operation.

7. The method of claim 6 wherein said assembly, after the heating operation, is cooled.

8. In the fabrication of diode and triode assemblies wherein a dot of metal comprising a significant impurity is alloyed to a broad face of a semi-conductor wafer base by applying the dot to the base, heating the assembly to effect interfacial fusion between said dot and said semi-conductor base, and cooling the assembly, the improvement which comprises, after applying the dot to the base and prior to heating the assembly, applying a flowable suspension of finely-divided refractory material over the exposed surfaces of the applied metal dot, but not the surface between the applied metal dot and the semi-conductor base, and over at least the immediately adjacent surfaces of the semi-conductor base and permitting it to harden in situ to provide a rigid, solid body of refractory material conforming to and completely covering the exposed contours of said dot and adhering to the exposed surfaces of said dot and at least the immediately adjacent surfaces of the semi-conductor base whereby, during heating of the assembly, the shape and position initially provided to the dot is maintained by said in situ-hardened refractory material, said refractory material being solid and inert to said applied metal dot during said heating operation.

9. The method of claim 8 wherein said base comprises a semi-conductive material selected from the group consisting of silicon, germanium, tin, germanium-silicon and indium-antimony; and wherein said dot comprises a significant impurity metal selected from the group consisting of antimony, bismuth, boron, aluminum, gallium and indium.

10. The method of claim 9 wherein said base comprises silicon; and wherein said dot comprises aluminum.

References Cited in the file of this patent

UNITED STATES PATENTS

| | | |
|---|---|---|
| 827,134 | White | July 31, 1906 |
| 1,335,024 | Peschko | Mar. 30, 1920 |
| 1,966,615 | Croning | July 17, 1934 |
| 2,560,594 | Pearson | July 17, 1951 |
| 2,697,052 | Dacey | Dec. 14, 1954 |
| 2,703,855 | Koch | Mar. 8, 1955 |
| 2,739,088 | Pfann | Mar. 20, 1956 |
| 2,759,846 | Vosler | Aug. 21, 1956 |
| 2,791,524 | Ozarow | May 7, 1957 |

FOREIGN PATENTS

| | | |
|---|---|---|
| 120,178 | Sweden | Sept. 11, 1947 |